US009502654B2

(12) United States Patent
Spee et al.

(10) Patent No.: US 9,502,654 B2
(45) Date of Patent: Nov. 22, 2016

(54) METHOD OF MANUFACTURING A MULTILAYER SEMICONDUCTOR ELEMENT, AND A SEMICONDUCTOR ELEMENT MANUFACTURED AS SUCH

(71) Applicant: Nederlandse Organisatie voor toegepast-natuurwetenschappelijk onderzoek TNO, 's-Gravenhage (NL)

(72) Inventors: Carolus Ida Maria Antonius Spee, 's-Gravenhage (NL); Paulus Wilhelmus Maria Blom, 's-Gravenhage (NL); Jack W. Levell, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 14/436,363

(22) PCT Filed: Oct. 18, 2013

(86) PCT No.: PCT/NL2013/050734
§ 371 (c)(1),
(2) Date: Apr. 16, 2015

(87) PCT Pub. No.: WO2014/062058
PCT Pub. Date: Apr. 24, 2014

(65) Prior Publication Data

US 2015/0287925 A1 Oct. 8, 2015

(30) Foreign Application Priority Data

Oct. 18, 2012 (EP) .................................... 12189061

(51) Int. Cl.

| | |
|---|---|
| ***H01L 21/00*** | (2006.01) |
| ***H01L 51/00*** | (2006.01) |
| ***C23C 16/455*** | (2006.01) |
| ***H01L 51/44*** | (2006.01) |
| ***H01L 51/52*** | (2006.01) |
| ***H01L 51/42*** | (2006.01) |
| ***H01L 51/50*** | (2006.01) |
| ***H01L 51/56*** | (2006.01) |

(52) U.S. Cl.
CPC ..... *H01L 51/0022* (2013.01); *C23C 16/45551* (2013.01); *H01L 51/0004* (2013.01); *H01L51/42* (2013.01); *H01L 51/44* (2013.01); *H01L 51/5012* (2013.01); *H01L 51/52* (2013.01); *H01L 51/56* (2013.01); *H01L 51/0034* (2013.01); *Y02E 10/549* (2013.01)

(58) Field of Classification Search
CPC ... H01L 51/0022; H01L 51/56; H01L 51/42; H01L 51/5012
See application file for complete search history.

(56) References Cited

U.S. PATENT DOCUMENTS

2006/0177690 A1* 8/2006 Su ...................... H01L 51/5048 428/690
2006/0199036 A1* 9/2006 Choong ............. H01L 51/5016 428/690

(Continued)

FOREIGN PATENT DOCUMENTS

| | | | |
|---|---|---|---|
| EP | 2281921 | A1 | 9/2011 |
| WO | WO2009103705 | A1 | 8/2009 |
| WO | WO2010024671 | A1 | 3/2010 |

OTHER PUBLICATIONS

Chang et al, "Enhanced OLED performance upon photolithographic patterning by using an atomic-layer-deposited buffer layer," Organic Electronics, vol. 9, pp. 667-672, 2008.

*Primary Examiner* — Laura Menz
(74) *Attorney, Agent, or Firm* — Hoffmann & Baron, LLP

(57) ABSTRACT

The present invention is directed to a method of manufacturing a multilayer semiconductor element. According to this method a first device layer is provided on a carrier by solution printing of a first material on the carrier. A second device layer is provided by solution printing of a second material solution on said first device layer; the second material solution comprising second device layer material dissolved in a solvent. Prior to solution printing of the second device layer, a barrier interlayer is added onto the first layer for being arranged in between said first and said second device layer. The barrier interlayer comprises an interlayer material insoluble to said solvent, and arranged for enabling electric interaction between the first and second device layer. The invention further provides a semiconductor element.

9 Claims, 6 Drawing Sheets

1 13 10 6 17 15 9 5 3

(56) References Cited

U.S. PATENT DOCUMENTS

2007/0029556 A1* 2/2007 Su .......................... H01L 51/002 257/79
2007/0176539 A1* 8/2007 Mathai ................ H01L 27/3239 313/504
2014/0138660 A1* 5/2014 Kugler ................ H01L 51/5088 257/40
2014/0175420 A1* 6/2014 Pan ..................... H01L 51/0039 257/40
2015/0064837 A1* 3/2015 Forrest ................ H01L 51/0028 438/82
2015/0287925 A1* 10/2015 Spee ................. C23C 16/45551 257/40
2016/0006002 A1* 1/2016 Forrest .................... H01L 51/56 438/34

* cited by examiner

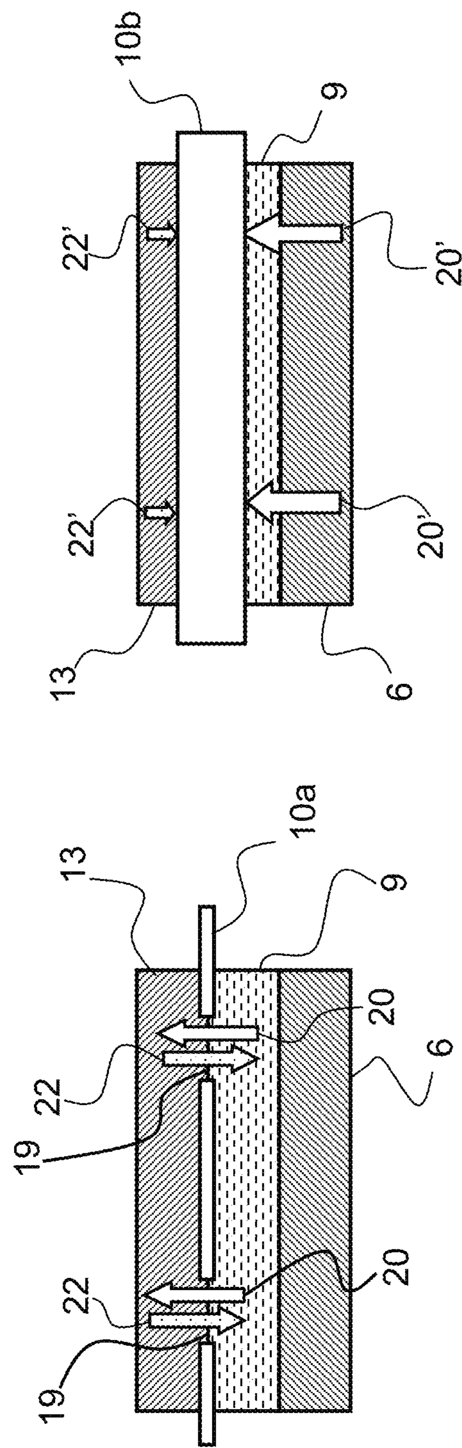
Fig. 2B
Fig. 2A
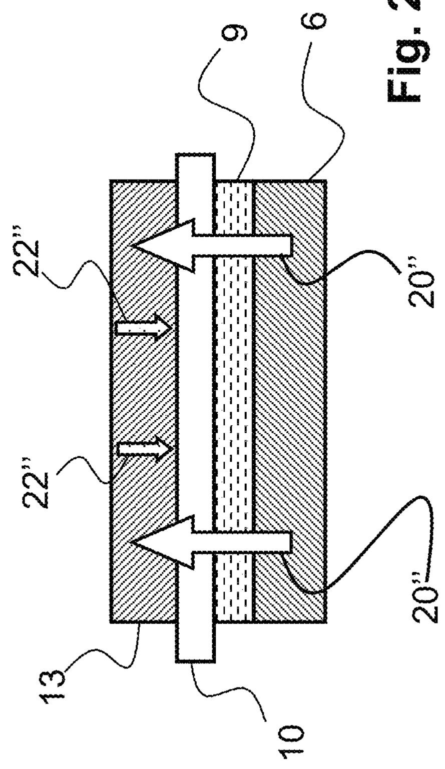
Fig. 2C

METHOD OF MANUFACTURING A MULTILAYER SEMICONDUCTOR ELEMENT, AND A SEMICONDUCTOR ELEMENT MANUFACTURED AS SUCH

This application is the U.S. National Phase of, and Applicants claim priority from, International Patent Application Number PCT/NL2013/050734 filed Oct. 18, 2013, which claims priority from EP 12189061.0 filed Oct. 18, 2012, each of which is incorporated herein by reference.

FIELD OF THE INVENTION

The present invention is directed to a method of manufacturing a multilayer semiconductor element, said method comprising the steps of: providing a carrier; providing a first device layer on said carrier by solution printing of a first material solution for forming said first device layer; and providing a second device layer by solution printing of a second material solution on said first device layer, said second material solution comprising second device layer material dissolved in a solvent. The invention is further directed to a multilayer semiconductor element manufactured using such a method.

BACKGROUND

The conventional organic multilayer devices, such as organic photovoltaic (OPV) devices, e.g. organic light emitting diode (OLED) devices, consist of a stack of layers of different material layers. A common technique exists in the application of one or more small molecule layers. The individual layers have specific functions such as hole transport layers, electron transport layers or emissive layers. The conventional method to deposit a small molecule layer in a multilayer stack for OLED/OPV devices is to evaporate each layer in a high vacuum evaporation tool. As may be appreciated, the use of a vacuum renders the manufacturing method to be time and cost consuming, as well as cumbersome.

A potentially advantageous alternative to the above method of evaporating each layer, would be to print a multilayer stack from solution printing. A solution printing process for manufacturing semiconductor elements typically consists of regular printing methods such as jet printing or slot dye coating, sometimes supported with added technology such as to create desired semiconductor patterns with necessary accuracy and complexity. The printing method allows for printing desired semiconductor materials which are dissolved in solvents, and enables to print such materials layer for layer. Such a method may also be used for printing organic semiconductor materials, e.g. for creating organic devices, such as photovoltaic (OPV) devices, e.g. organic light emitting diode (OLED) devices.

A known problem in multilayer deposition of small molecule layers from solutions, such as the above printing method, is the fact that when a layer is deposited onto another layer, part or most of the material in the underlying layer will dissolve in the solvent used for the deposited layer. This makes multilayer processing from solution very difficult.

One method to solve this problem is the use of small molecules which dissolve in different (orthogonal) solvents, so that a second solution will not dissolve the first layer.

However the resulting small molecules are not necessarily optimal for their purpose in an OLED or OPV stack, and it is a material-dependent rather than generic solution to the problem.

Another possible solution is to perform a treatment step on the underlying layer to treat the small molecules of the underlying layer after deposition in such a way that they do not dissolve anymore. Such a treatment may exist in annealing (usually at around 180° C.) or lowgrade polymerisation or cross-linking (of the material itself or of a host matrix). However annealing at high temperatures is not possible when plastic substrates are used and the agents used for cross linking can damage the devices, e.g. resulting in poor lifetimes of the OLED's.

Another possibility is to use a liquid buffer layer of a material such as ethylene glycol. Such a buffer is deposited onto the first organic layer. The second organic layer is then deposited on top of the buffer, and the liquid buffer slowly evaporates through the deposited top layer as it dries. This prevents intermixing with the lower organic layer with the solvent of the deposited layer. However, this method has only been shown to work for very small samples (few $cm^2$) and depends a lot on the wetting or surface energies of the materials.

Another alternative is to use very high molecular weight materials which would take a long time to dissolve when a second organic layer is deposited from solution on top of them. However it is difficult to solution process high molecular weight materials, and as a result it is cumbersome to perform this accurately. Furthermore, this is another alternative that limits the choice of materials for the designer. The high molecular weight materials are not necessary the best candidates for the design of the semiconductor device at hand. For example, for OLED's such materials are not desirable for the emitting layer as the polymer host materials usually have a triplet energy which is low enough for allowing back transfer from the blue phosphor to the polymer host, resulting in sub-optimal performance.

Lamination of two halves of a multilayer semiconductor element is another "dry" technique which has been used to make multilayers. The adhesion of the two layers and the exclusion of any defects is however critical here, increasing the chance on defects and thus decreasing the yield of the process. Moreover, if this technique is to be used multiple times within a device it would also involve the use of many carrier foils.

SUMMARY OF THE INVENTION

It is an object of the present invention to alleviate the abovementioned problems of the prior art, and to provide a manufacturing method for multilayer semiconductor devices that can be performed fast, having a high yield at optimal costs, wherein the problem of dissolving layers during manufacturing is resolved to a workable extend.

The above mentioned objects of the invention are achieved in that there is provided a method of manufacturing a multilayer semiconductor element, said method comprising the steps of: providing a carrier; providing a first device layer on said carrier by solution printing of a first material solution for forming said first device layer; and providing a second device layer by solution printing of a second material solution on said first device layer, said second material solution comprising second device layer material dissolved in a solvent; wherein said method comprises a step of providing prior to providing said second device layer a barrier interlayer for being arranged in between said first and said second device layer, said barrier interlayer comprising an interlayer material being insoluble to said solvent, and said barrier interlayer being arranged for enabling electric interaction between said first device layer and said second device layer.

The invention is based on the insight that providing the barrier interlayer as defined above can be done in a relatively quick manner, while it also enables to perform the application of the second device layer by means of a step of solution printing. Although it's primary function is to prevent the solvent from the second layer to damage the first layer during manufacturing of the device, the barrier interlayer is an additional device layer that remains present in the device once it is manufactured, and therefore the properties and physical behaviour of the layer are important. The barrier interlayer in between the first and the second device layer prevents the solvent of the second device layer from reaching the first device layer (or at least with use of the amount of solvent reaching the first device layer to a minimum). As a result, the first device layer will be kept intact, and undamaged upon application of the second device layer. The interlayer material of the barrier interlayer and the other properties of the barrier interlayer are such that the barrier interlayer enables electric interaction between the first device layer and the second device layer. This electric interaction is necessary for enabling the multilayer semiconductor element provided using the manufacturing method of the present invention to perform as required. In particular, and as an example, a barrier interlayer as defined above may be applied in between a hole transportation layer (HTL) and an emissive layer (EML) of an organic light emitting diode (OLED), wherein the barrier interlayer must be arranged for enabling hole migration from the HTL to the EML. The invention is however not limited to application thereof in OLED's, but may be applied to other multilayer semiconductor elements as well, which may be manufactured using a solution printing method. Examples thereof are organic photovoltaic elements (OPV), organic field effect transistors (OFET's) and other organic semiconductor elements.

According to an embodiment of the present invention, providing of the barrier interlayer comprises a step of atomic layer deposition for forming the barrier interlayer on the first device layer. It has been found that atomic layer deposition provides a suitable method for applying the barrier interlayer on to the first device layer in the method of the present invention. Preferably, the atomic layer deposition step to be performed is a fast atomic layer deposition method. Fast atomic layer deposition is a method of performing atomic layer deposition by relatively moving a substrate or carrier subsequently pass one or more precursor or reactor gas sources for performing the atomic layer deposition method in a fast and efficient manner. The technique of fast atomic layer deposition is developed by the inventors of the present invention, and is for example described in WO 2010/024671. In fast atomic layer deposition technique (fast ALD), sometimes referred to as spatial ALD, the precursors are dosed simultaneously and continuously, but at different half-reaction zones. The substrate moves between these zones where the half-reactions take place.

The fast atomic layer deposition method as described above, in combination with the solution printing method for providing the first device layer and the second device layer provides a very efficient and fast manner of manufacturing a multilayer semiconductor elements in accordance with the invention. As a result of the barrier interlayer in between the first device layer and the second device layer, the solvent from the second device layer will not damage the first device layer during manufacturing, since the first device layer is covered by the barrier interlayer during manufacturing. Using the fast atomic layer deposition method for providing the barrier interlayer enables to provide a barrier interlayer having a desired thickness: the thickness of the layer can be predetermined accurately during the fast atomic layer deposition method. This guarantees that the barrier interlayer provided fulfils the necessary requirements for effectively enabling electric interaction between the first and second device layer, while at the same time providing an effective barrier for the solvent from the second device layer such as to protect the first device layer. As will be appreciated, the invention is not limited to the use of atomic layer deposition for applying the barrier interlayer. Other suitable methods may be used, dependent on the material compositions of the barrier interlayer and the first and second device layer, and the required or desired thickness for the barrier interlayer.

According to a further embodiment of the invention, the barrier interlayer as provided having a thickness dependent on the interlayer material, for effectively preventing the solvent to reach the first device layer, and for allowing the electric interaction between the first device layer and the second device layer. Dependent on the specific material chosen as interlayer material for the barrier interlayer, the thickness of the layer is an important parameter for determining to what extent the barrier interlayer is able to provide the electric interaction, and at the same time prevent the solvent from penetrating through the barrier layer. As will be described further below, a barrier layer which is too thin may comprise defects such as cracks or holes, through which the solvent may reach the first device layer. At the same time, when the thickness of the barrier layer is too large, the barrier layer not only prevents the solvent from reaching the first device layer, but in addition it also prevents charge from the first device layer to reach the second device layer: effectively blocking electric interaction between the first device layer and the second device layer. As will be appreciated, for each specific interlayer material, the optimal thickness may be different.

The minimal thickness in any case is a single monolayer. However, in order to provide an interlayer that is sufficiently thick to be free of any undesired openings, a minimum of 3 monolayers may be preferred (corresponding to approximately 0.6 nm). For an interlayer of insulating material, the maximum thickness is 5 nm, determined by the fact that tunnelling of charge must remain possible. For a semiconductor as interlayer there is in principle no upper limit, although thinner is better in general. Therefore, according to a further embodiment, the barrier interlayer is provided having a thickness larger than 0.2 nm (single monolayer), and preferably within a range of 0.6 nm through 5 nm for insulating barrier interlayers, and greater than 0.6 nm for semiconductor barrier interlayers.

According to a further embodiment of the present invention, the interlayer material may comprise at least one of an insulating material or a semiconductor material. It has been found that a barrier interlayer of a conductive material is counterproductive in view of its tendency to function as an additional electrode, and at the same time giving rise to capacitive charging of the layer. However, suitably chosen insulating materials or semiconductor materials, as will be explained below, provide good candidates for use as barrier interlayer. For semiconductor materials used in the barrier interlayer, a band gap of the interlayer material must be larger than or equal to a band gap of an (organic) semiconductor present in the first or second device layer.

Where the interlayer material is an insulating material, it may comprise at least one of a group comprising aluminium oxide ($Al_2O_3$), silicon oxide ($SiO_2$), $SiO_xN_y$, $Si_3N_4$, $TiO_2$, $Ta_2O_5$, $Al_2O_3$, $ZrO_2$, $HfO_2$, $La_2O_3$, $SrTiO_3$, and $BaTiO_3$. Where the interlayer material is a semiconductor material, it may comprise at least one of a group comprising doped or undoped oxide semiconductor materials and oxide semiconductor materials comprising substoichiometric oxide, such as doped or undoped ZnO, doped or undoped $SnO_x$ such as ITO, doped or undoped $ZrO_x$, doped or undoped $InO_x$, doped or undoped $RuO_x$, doped or undoped $WO_x$, doped or undoped $EuO_x$, doped or undoped $NiO_x$, doped or undoped $VO_x$, doped or undoped $PbO_x$, doped or undoped $CeO_x$, doped or undoped $MoO_x$, doped or undoped $Ni_2O_3$, or doped or undoped $Zn_xSn_yO_z$, and non-oxide semiconductor materials, such as doped or undoped ZnS, and doped or undoped ZnSe, ZnTe, CdS, and CdSe, and organic semiconductor materials, such as $AlxGayIn_{1-x-y}N$ or other semiconductor nitrides or sulfides. In general (but not exclusively) materials may be considered that are suitable for application by means of atomic layer deposition, or materials that otherwise may be applied having an effective thickness for obtaining the effects described herein.

It has been found that for use in an organic light emitting diode, zinc oxide as mentioned above may not be a good candidate, since the relatively low conduction band energy causes the barrier interlayer to function as an electron trap. However, for other applications, zinc oxide has the potential to be a good candidate for use as an interlayer material as it may well be applied in a controlled manner having a predetermined thickness. Aluminium oxide, as mentioned above, has been found to be a perfect candidate for use in a barrier interlayer material, in particular for manufacturing OLED's.

Alternative good candidates for use as a barrier interlayer material may be selected from known semiconductor materials based on a number of properties. For a semiconductor material to be suitable for use as interlayer material, apart from the chemical properties with respect to the solvent used for depositing the second device layer, the highest energy level in the valence band of the semiconductor material is an important parameter for selecting or discarding a semiconductor material. Dependent on the application, for most materials, the highest valence band energy level of the candidate semiconductor material for use as an interlayer material must have an energy within the range of 1 eV from a highest valence band level of either the first device layer or the second device layer (or both). Preferably, the highest valence band energy level of the semiconductor material for use as an interlayer material is in between the highest valence band energy level of the first device layer and the highest valence band energy level of the second device layer. Together with the chemical properties with respect to the solvent in use for applying the second device layer, a semiconductor material with the highest valence band energy level as defined above allows for a smooth transportation of charge carriers across the barrier interlayer, while at the same time effectively blocking the solvent from penetrating through the barrier interlayer.

Despite the above, some materials have been found that may be applied as barrier interlayer to which the above relation between valence band levels of the interlayer and the first and second device layer does not apply. For these materials, the difference in energy levels between the valence band of the interlayer and those of the device layer is of the order of 5 to 10 eV, while nevertheless the device manufactured works nicely. An example of such a material for use as barrier interlayer is $MoO_3$. For $MoO_3$, not only the shifted energy levels are at 6.7 eV and 9.7 eV, but this material also allows for a much thicker barrier interlayer (within the order of tens of nanometers), without negatively affecting operation of the device manufactured. $MoO_3$ also allows for application by means of water-based solution printing. Therefore, as long as the first and second device layers are not solution printed using a water-based printing technique, the use of $MoO_3$ allows for application of the barrier interlayer by means of water-based solution printing instead of for example ALD.

According to a further embodiment, the interlayer material comprises a semiconductor material having a lowest conduction band energy level in a range within 1 eV from a lowest conduction band energy level of either the first device layer or the second device layer (or both). Preferably, the lowest conduction band energy level of the candidate semiconductor material for use as an interlayer material is in between the lowest conduction band energy level of the first device layer and the second device layer.

Although the method of the present invention may be applied for creating all kinds of multilayer semiconductor elements that are manufactured by means of one or more solution printing steps, it has been found that the method of the present invention is in particular useful in manufacturing multilayer organic semiconductor elements. Moreover, a particular application wherein the method of the present invention may be applied is in the manufacturing of organic light emitting diodes (OLED's). However, the skilled person may appreciate that the invention is not limited to the above mentioned fields of the application.

In addition, although the invention will in the present description be explained by means of an example wherein only a single barrier interlayer is to be interposed in between a first device layer and a second device layer (the second device layer being solution printed on the first device layer), the skilled person may appreciate that in specific applications, multiple layers may subsequently be applied by means of solution printing techniques, and a barrier interlayer may be interposed in between any two layers of such a multilayer stack. In particular, the multilayer semiconductor device as created may comprise several barrier interlayers if this is considered productive.

According to a second aspect of the invention, the invention is directed to a multilayer semiconductor device manufactured using a method as described above, wherein the semiconductor device comprising: a carrier; a first device layer on said carrier; and a second device layer formed on said first device layer using a solution printing step of a second material solution; said semiconductor element further comprising: a barrier interlayer in between said first and said second device layer, said barrier interlayer comprising an interlayer material being insoluble to a solvent used during solution printing of said second device layer, and said barrier interlayer being arranged for enabling electric interaction between said first device layer and said second device layer.

As already described above, such a multilayer semiconductor element may be in the form of a multilayer organic semiconductor element, such as in particular an organic light emitting diode (OLED).

BRIEF DESCRIPTION OF THE DRAWINGS

The invention will further be elucidated by description of some specific embodiments thereof, making reference to the attached drawings, wherein:

FIG. 2*a* through FIG. 2*c* illustrates the effect of the thickness of the barrier interlayer on the present invention;

DETAILED DESCRIPTION

Figure 1:
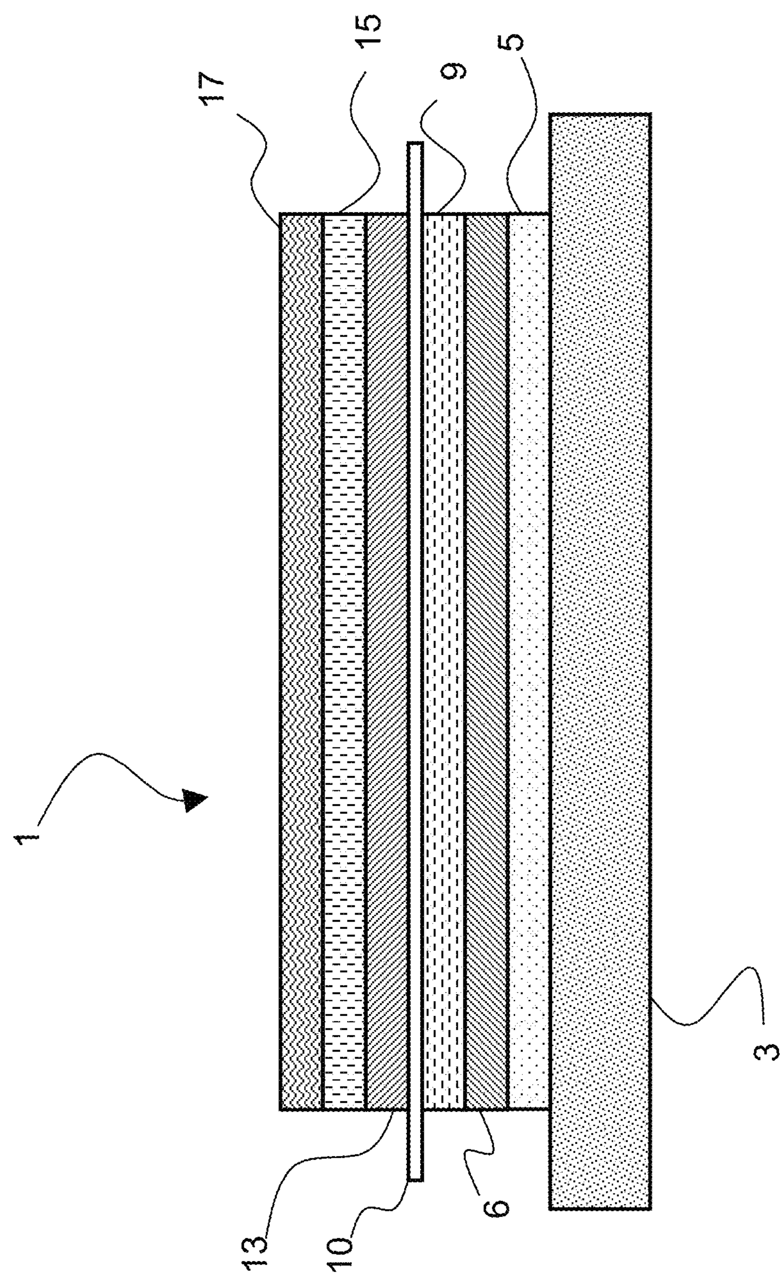
FIG. 1 illustrates an organic light emitting diode manufactured using a method according to the present invention.

FIG. 1 illustrates organic light emitting diode device 1 which is manufactured using a method according to the present invention. The OLED 1 of the invention comprises a carrier 3 on which an anode 5 is deposited. A carrier 3 may be a glass carrier or a polymer, while the anode 5 may be made of any conductive material such as (but not limited to) indium tin oxide (ITO). On top of the ITO anode 5, a hole injection layer is deposited, for example comprising poly(3,4-ethylenedioxythiophene)-tetramethacrylate (PEDOT-TMA) or poly(3,4-ethylenedioxythiophene) poly(styrenesulfonate) (PEDOT-PSS).

On top of the hole injection layer 6, the OLED 1 of the present invention comprises a hole transportation layer (HTL) 9. The hole transportation layer may be made of any suitable material, known to the skilled person. However, in order to enable the application of the hole transportation layer 9 using a solution printing method, good candidate materials for the hole transportation layer may be any of the following: arylamines, isoindole, fluorenes, TPD (N,N-diphenyl-N,N-bis(3-methylphenyl)-1,1-biphenyl-4,4-diamine), NPB (1,4-bis(1-naphthylphenylamino)biphenyl), α-NPD (N,N'-di(naphthalen-2-yl)-N,N'-diphenyl-benzidine), m-MTDATA (4,4',4"-tris(3-methylphenylphenylamino)triphenylamine); TCTA (4,4',4"-Tris(carbazol-9-yl)-triphenylamine), 3DTAPBP (2,2'-bis(3-(N,N-di-p-tolylamino)phenyl)biphenyl), TFB (Poly[(9,9-dioctylfluorenyl-2,7-diyl)-co-(4,4'-(N-(4-secbutylphenyl) diphenylamine)]). These examples are provided for illustrative purposes, and are not intended to be limiting on the invention.

In accordance with the present invention, a barrier interlayer is provided on to the HTL 9 by means of a fast atomic layer deposition process. The use of the fast atomic layer deposition process for providing the barrier interlayer enables to provide the barrier interlayer having a thickness of only a few nanometers. The interlayer material used for providing the barrier interlayer made for example the aluminium oxide ($Al_2O_3$), but this may be dependent on a specific choice of materials for the hole transportation layer 9 and the emission layer 13 (to be subsequently provided). A number of candidate interlayer materials for use in the barrier interlayer have been identified throughout this description.

After applying the barrier interlayer on top of the HTL 9, an emission layer 13 is provided on to the barrier in the layer using again a solution printing process. The emission layer 13 has been added to the barrier interlayer 10 by dissolving a suitable material for the emission layer 13 in a solvent and performing the solution printing process. In this respect, it is the function of the barrier interlayer to prevent the solvent from the emission layer 13 to reach the underlying hole transportation layer 9. This effectively prevents any damage to the hole transportation layer 9 during manufacturing. A suitable choice of materials for providing the emission layer is known to the skilled person, however some examples are provided herewith for illustrative purposes only: metal chelates, such as Alq3 (tris(8-hydroxyquinoline)aluminium), Ir(ppy)3(factris(2-phenylpyridine)iridium) in CPB (4,4-N,N-dicarbazole-biphenyl), FIrPic (Bis(3,5-difluoro-2-(2-pyridyl)phenyl-(2-carboxypyridyl)iridium(III)) in DCzPPy (2,2'-bis(3-(N,N-di-p-tolylamino)phenyl)biphenyl), or Ir(pic)3 (Tris(1-phenylisoquinoline)iridium(III)); materials having an anthracene structure, a pentancene structure or a Perylene structure; and silanes. These examples are not intended to be limiting on the invention.

On top of the emission layer, the OLED 1 of the present invention comprises a electron transmission layer (ETL) 15 and a cathode 17. The cathode 17 may be made of any conductive material. The electron transmission layer (ETL) 15 may be suitably selected by the skilled person from the known alternatives, such as: ETLs (e.g. diazoles, boranes, phenanthrolines, carbazoles, pyridyls), BCP (2,9-dimethyl-4,7-diphenyl-1,10-phenanthroline), TPBI (1,3,5-tris(N-phenylbenzimidizol-2-yl)benzene), BmPyPhB (1,3,5-tri[(3-pyridyl)phen-3-yl]benzene (TmPyPB), 1,3-bis[3,5-di (pyridine-3-yl)phenyl]benzene (BmPyPhB)), and combinations thereof. These examples are provided for illustrative purposes, and are not intended to be limiting on the invention.

As explained herein above, the barrier interlayer 10 not only prevents the solvent from the emission layer 13 to reach the underlying hole transmission layer 9, but after manufacturing, the barrier interlayer enables effective electric interaction between the HTL 9 and the ENL 13. As a result, holes may migrate or tunnel through the barrier interlayer 10 into the emission layer 13, providing full functionality to the OLED 1 upon powering thereof.

The relevance of the thickness of the barrier interlayer 10 in a device and method of the present invention is illustrated in FIGS. 2*a* through 2*c*. In FIG. 2*a* hole injection layer 6, hole transportation layer 9 and emission layer 13 of the OLED 1 of FIG. 1 are schematically illustrated. The interlayer 10*a* in the example of FIG. 2*a* is extremely thin (e.g. one monolayer). As a result, since the barrier interlayer 10*a* of the example of FIG. 2*a* is too thin, it may comprise pinholes or open spaces 19 across its surface. As indicated schematically by arrows 20, holes from the hole injection layer may reach the emission layer 13 as intended. However, at the same time, during manufacturing, the solvents 22 from the emission layer may also reach the underlying hole transportation layer 9. The hole transportation layer 9 may therefore be damaged during manufacturing.

In FIG. 2*b*, the barrier interlayer 10*b* in between the HTL 9 and EML 13 is too thick (for example larger than 50 nm). As a result, this not only prevents the solvents from the EML 13, as schematically illustrated by the arrows 22', from reaching the HTL 9, but it also prevents the holes from the hole injection layer 6 to reach the EML 13. The OLED illustrated in FIG. 2*b* will not function.

In FIG. 2*c*, the barrier interlayer of the present invention is created having just the right thickness, e.g. 3 monolayers (0.6 nm) or within the range indicated hereinabove dependent on whether an insulating material or semiconductor material is applied. This allows for any holes from the hole injection layer 6 to tunnel through the barrier interlayer 10 to the EML 13, providing a fully functional OLED. At the same time, during manufacturing, any solvents from the EML 13 used for solution printing thereof, are effectively blocked by barrier interlayer 10 as schematically indicated by arrows 22".

Figure 3:
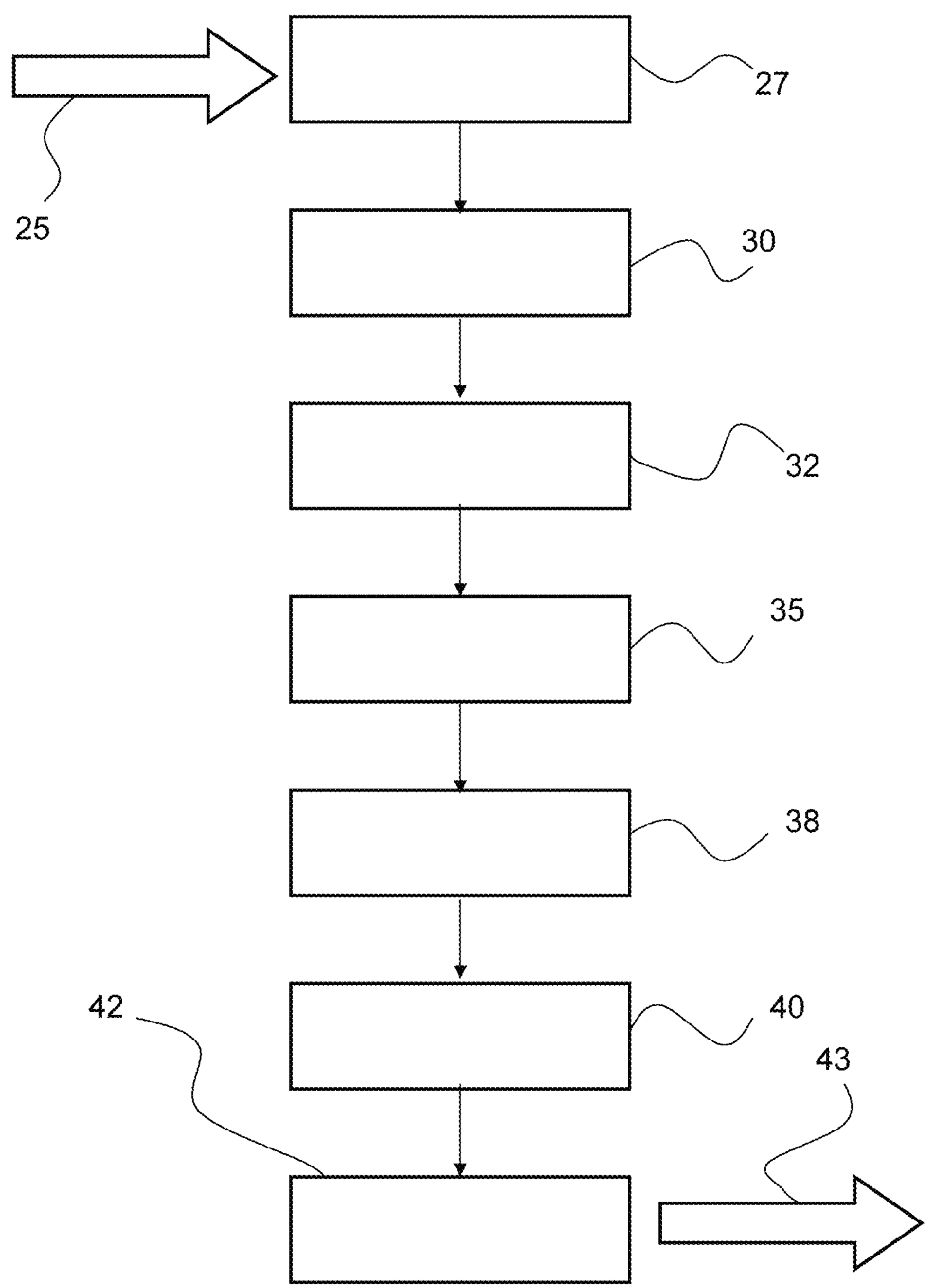
FIG. 3 schematically illustrates a method according to the present invention.

FIG. 3 illustrates a method of the present invention. In FIG. 3, the method starts (25) with step 27 providing the carrier. Subsequently, in step 30, a number of layers such as the anode and the hole injection layer may be deposited on to the carrier 30. Then in step 32, a solution printing process is performed for printing the first device layer, e.g. the hole transportation layer 9 of the OLED 1 of FIG. 1. After applying the first device layer by the solution printing process in step 32, the first device layer is dried by evaporating the solvent used for applying the layer. In step 35, a fast atomic layer deposition method is performed for creating a very thin (few nanometers) but effective barrier interlayer on top of the first device layer.

Then in step 38, a further solution printing method is performed for printing the second device layer. The solution printing method applies the second device layer by applying a solution which is based on a solvent comprising the required material for the second device layer. The barrier interlayer provided in step 35 then prevents the solvent from reaching the underlying first device layer, thereby preventing any damage. After evaporation of the solvent 38, the method continues in step 40 and 42 wherein respectively the electron transportation layer (step 40) and the cathode (step 42) are deposited on top of the second device layer. The method ends in step 43. As will be appreciated, the above described method may be part of a larger production process for creating an electronic device.

Tests were performed on the proposed multilayer semiconductor elements comprising barrier interlayers in accordance with the invention. A test series on different multilayer organic light emitting diodes (OLED's), with an interlayer of $MoO_3$ deposited using conventional ALD, is described here. The subsequent layers from the glass carrier surface to the top cathode surface, defining the structure of the tested OLED's, is provided herewith. For the hole transportation layer, different material layers were used comprising an aromatic amine (solution printed HTM9 manufactured by Solvay).

Carrier: Glass
Anode: Indium Tin Oxide (ITO)
Hole Injection Layer: PEDOT (Clevios Al.4083)
Hole Transportation Layer: HTM9
Barrier interlayer: $MoO_3$ layer (thickness: 3 nm, applied by evaporation)
Emission Layer: Host 2 with 20% by weight hex-Ir(phq) (=Bis[2-(4-n-hexylphenyl)quinoline](acetylacetonate) iridium(III)) (solution printed)
Electron Transport Layer: TPBI (=2,2',2"-(1,3,5-benzinetriyl)-tris(1-phenyl-1-H-benzimidazole)); 30 nm evaporated, including LiF layer (1 nm)
Cathode: Al (100 nm)

Figure 6:
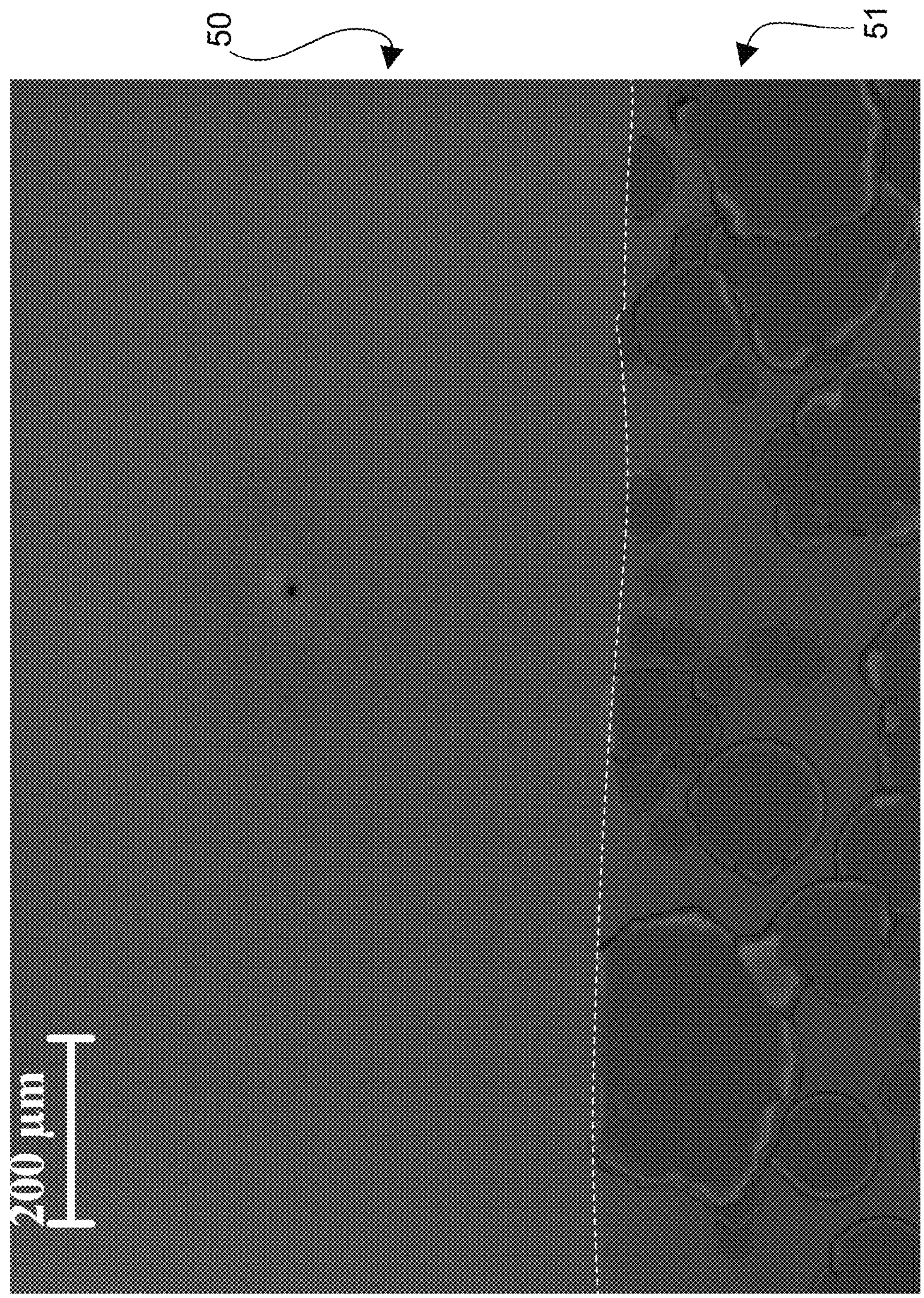
FIG. 6 is an image of the edge of an area protected by $MoO_3$ of a sample device following spray testing.

The devices were seen to work with the current densities specified in FIG. 4, dependent on the voltage applied, as will be explained further below. The barrier interlayer of $MoO_3$ effectively has prevented damage to the HTL, while at the same time enabling the required electric interaction between layers. This can be seen for example in FIG. 6, showing an image of the edge of the area protected by $MoO_3$ and of sample device 20 (see table 1 below) following spray testing. The unprotected area 51 shows the affected regions, while the protected area 50 is largely free of such regions. The edge between protected area 50 and unprotected area 51 is indicated by means of the white dashed line in FIG. 6.

The PEDOT used was Clevios PVP. Al 4083. It was filtered through a 0.45 μm filter prior to spin coating in air. For the HTL layer, the solutions used in this experiment were Solvay HTM1, HTM9, and Solvay orange Hex-Ir (phq)3 20% by weight blended with Solvay Host 2 80% by weight. The solutions were prepared using toluene that had been filtered through a 0.45 μm filter to a concentration of 10 milligrams/milliliter. The solution was stirred overnight at room temperature. These solutions were filtered again through a 0.45 μm filter prior to spin coating.

The devices were prepared as follows. 30×30 mm ITO and quartz substrates were cleaned by scrubbing and sonication in tepol solution and deionized water. They were then stored overnight in a sealed STB in the polyLED deco room. The ITO substrates were treated with a 10 minute ozone treatment prior to PEDOT spinning coating with 300 μl at 1000 rpm for 10 seconds with the lid closed. The PEDOT coated substrates were placed on a hotplate in air at 100° C. to pre-dry them while other samples were being spin coated. All the samples were baked in a glovebox for 20 minutes at 160° C. Substrates 1-13 were then spin coated with cross-linkable HTL, Solvay HTM 1. This was done at 1000 rpm for 10 seconds followed by 500 rpm for 30 seconds. The samples were then baked for 10 minutes at 180° C. to induce cross linking. ITO substrates 15-20 were spin coated with HTM 9 at 1000 rpm for 10 seconds followed by 500 rpm for 30 seconds followed by baking at 140° C. for 5 minutes. The substrates were placed in the evaporator for the deposition of 40 nm, 10 nm, 5 nm or 3 nm of $MoO_3$. Substrates 1-11 and 13 were spin coated with the Solvay orange solution at 1000 then 500 rpm for 10 sec then 30 sec. The emissive layer was baked for 10 minutes at 140° C. Finally substrates 1-11, and 13 were placed in an evaporator for the deposition of 30 nm of TPBI, 1 nm of LiF and 100 nm of aluminum as the cathode stack. Spray testing of substrates 15-20 was done using toluene at a flow rate of 0.1 ml/min from a height of 10 mm at a table speed of 25 mm/s. For the runs, the following devices were obtained.

TABLE 1

| Substrate/Device | HTL | $MoO_3$ Interlayer |
|---|---|---|
| 1 | HTM 1 - crosslinked | 40 nm |
| 2 | HTM 1 - crosslinked | 40 nm |
| 3 | HTM 1 - crosslinked | 10 nm |
| 4 | HTM 1 - crosslinked | 10 nm |
| 5 | HTM 1 - crosslinked | 5 nm |
| 6 | HTM 1 - crosslinked | 5 nm |
| 7 | HTM 1 - crosslinked | 3 nm |
| 8 | HTM 1 - crosslinked | 3 nm |
| 9 | HTM 1 - crosslinked | 3 nm |
| 10 | HTM 1 - crosslinked | No |
| 11 | HTM 1 - crosslinked | No |
| 12 | PEDOT reference | |
| 13 | HTM 1 - crosslinked | No |
| 14 | Does not exist | — |
| 15 | HTM 9 | 40 nm |
| 16 | Does not exist | — |
| 17 | HTM 9 | 10 nm |
| 18 | HTM 9 | 5 nm |
| 19 | HTM 9 | 3 nm |
| 20 | HTM 9 | 3 nm |

Figure 4:
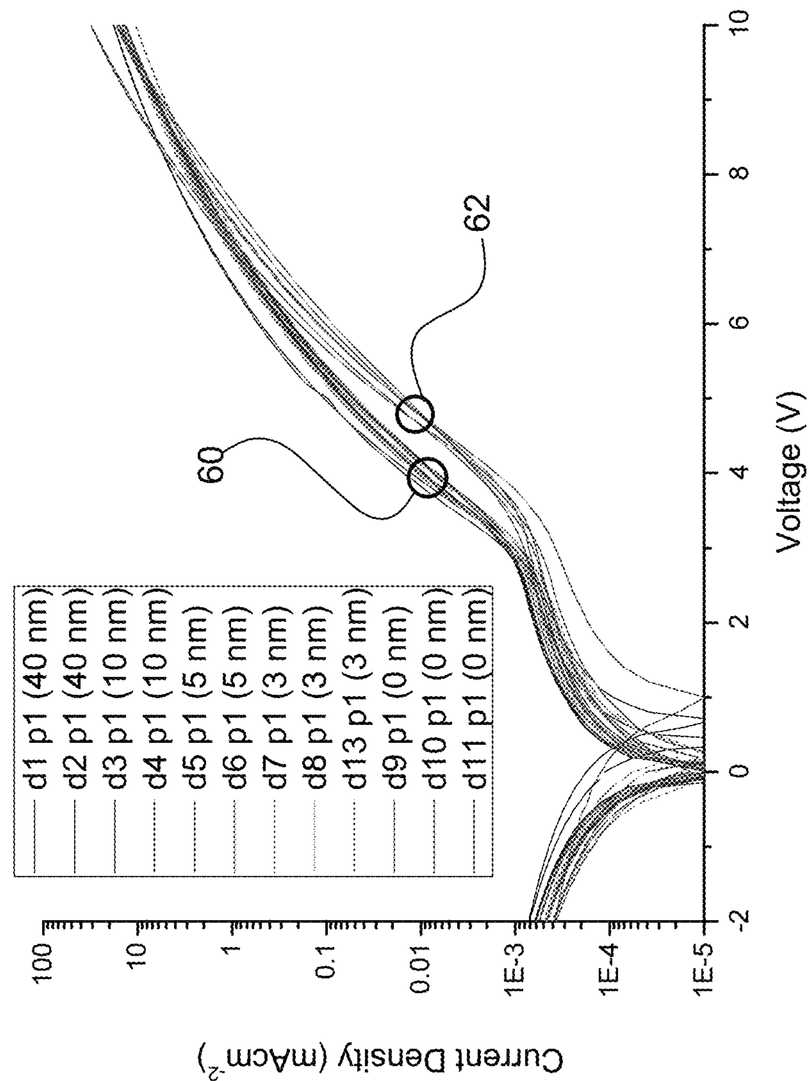
FIG. 4 provides JV characteristics of pixels of multiple devices tested, some devices comprising a barrier interlayer in accordance with the invention.

A comparison of the JV characteristics of pixel on each of the device substrates is illustrated in FIG. 4. The curves generally indicate with reference numeral 60 are the curves for devices 1 through 8 and 13 having $MoO_3$ layers of different thicknesses, while the curves indicated generally by 62 correspond to devices 9 through 11 having no $MoO_3$ layer (see table 1). The JV properties of the $MoO_3$ coated layers are similar despite the large differences of $MoO_3$ thickness from 3-40 nm. The purple curves, showing the devices without $MoO_3$, have a higher $V_{bias}$ for turn on and a steeper IV curve. This suggests the $MoO_3$ is highly conductive and it's thickness is not important for the electrical properties of the devices. The modification to device properties instead comes from interfacial effects.

Figure 5:
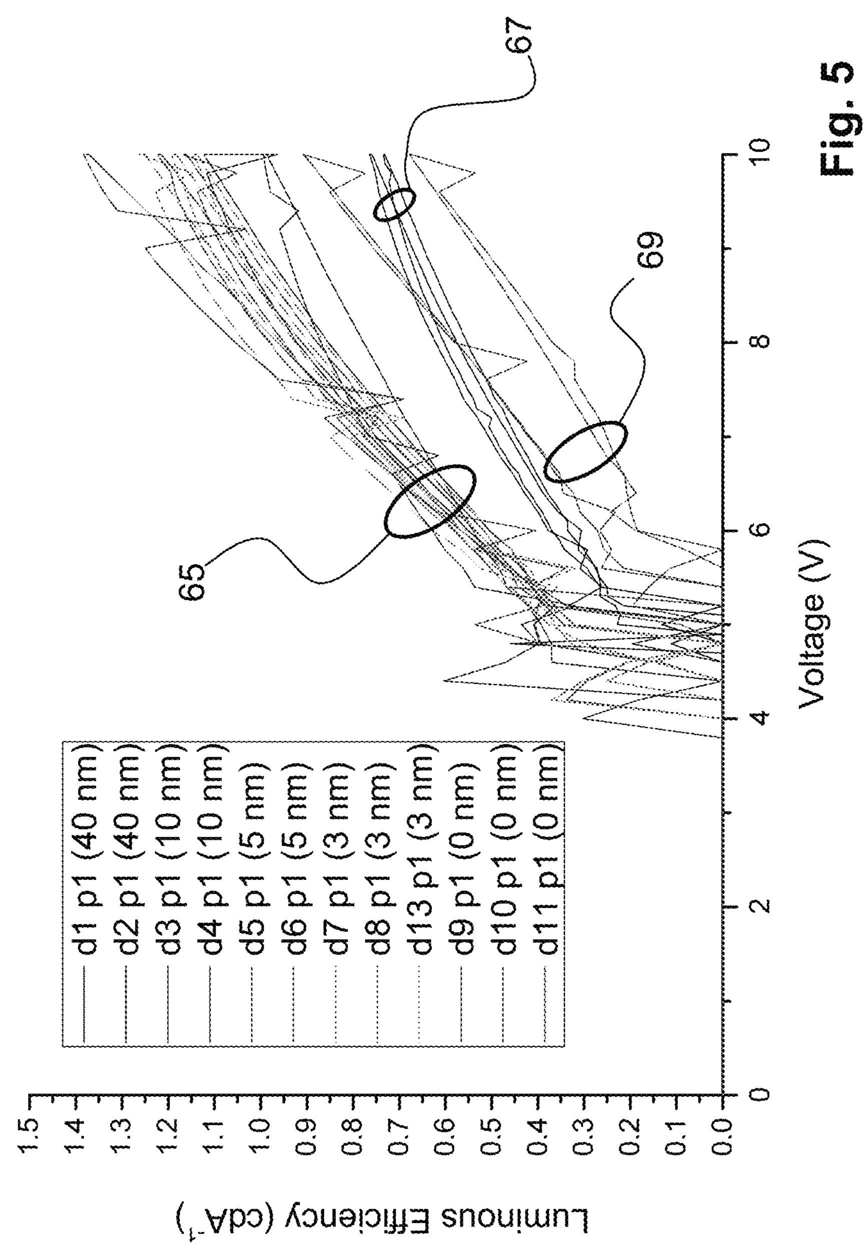
FIG. 5 provides a comparison of the current efficiency of various devices of FIG. 4 and table 1.

A comparison of the current efficiency of the various devices is illustrated in FIG. 5. Curves 67 correspond to devices 1 and 2, having an $MoO_3$ layer of 40 nm. Curves 65 correspond to devices 3 through 8 and 13, having different $MoO_3$ layer thicknesses as indicated in table 1. Curves 69 correspond to the devices 9 through 11 having no $MoO_3$ layer. Most devices follow the same general trend, however four devices have lower efficiencies: two devices with no $MoO_3$ and two devices with 40 nm $MoO_3$. The devices without $MoO_3$ are probably outliers as the efficiency of the other $MoO_3$ device is significantly higher and matches the other devices. This indicates that the $MoO_3$ layer does not significantly reduce the current efficiency if less than 10 nm.

This invention describes the use of a cost effective fast atomic layer deposition (fast ALD) technique to deposit a very thin (max a few nanometers) layer of a material on top of an organic layer. In particular, the invention is to deposit a thin (inter)layer of material by fast ALD between two organic layers in a multilayer semiconductor device, in particular an organic multilayer semiconductor device, more in particular and organic light emitting diode (OLED) stack, which is otherwise made by solution processing in order to prevent intermixing of the two solution processed organic layers.

The material deposited by fast ALD is chosen such that it cannot be dissolved in the solvents used to deposit a subsequent organic layer from solution, and therewith protects the lower organic layer from dissolving. The method of the invention provides a "dry" deposition process to create a very thin (few nm), closed barrier interlayer, and can be performed quickly with the total production system under atmospheric conditions. The invention therefore provides a very attractive and promising method for enabling mass production of organic multilayer semiconductor devices such as OLED's in electronics industry.

The method of the invention is generic and does not require tuning of the organic layer material properties or solvents used to deposit them. This means that the properties of the organic materials in the different layers can be tuned just for optimum device performance and do not also have to be adapted to prevent intermixing of layers.

The fast ALD deposition can be performed quickly in a roll-to-roll process, making application of the invention in a mass production process possible. Moreover, it may be performed under atmospheric conditions (reducing the cost and time compared to disposition of an impermeable interlayer in a vacuum process).

As the deposition head in a fast ALD process may be just 5 μm from the sample there can also locally be low pressure (0.01-100 mbar) conditions. Closed layers can be achieved for thicknesses of just 1 nm using ALD, so even if an insulating material is deposited it should not have too much of a detrimental effect on the charge transport within the device. A thin layer of, for example, an insulating material of only a few nm in thickness enables tunnelling of charge carriers such as holes, while at the same time effectively preventing a solvent from penetrating. A large number of different materials can be deposited by ALD and some dopant materials (making inorganic materials conducting) can also be added to the layer. As a result, the conductivity and bandstructure are tunable to a small extent. Fast ALD can be performed at relatively low temperatures to have no damage to the underlying organic layer.

The fast-ALD equipment used to deposit the interlayer would either be a sheet-to-sheet or a roll-to-roll fast ALD machine. Atomic layer deposition (ALD) has already been shown to work for a very large range of materials, oxides, nitrides, metals etc. Fast ALD is inherently an ALD machine, enabling the application of the same large range of materials as ALD. Fast ALD can be performed by means of thermally induced chemical reactions, but it can also be combined with a plasma or laser treatment, enlarging the number of possible materials and lowering deposition temperatures.

Although the use of fast-ALD provides synergies in the manufacturing methods described here, it will be appreciated that there are other techniques for creating thin layers of material that may be applied as well, such as chemical vapour deposition (CVD), physical vapour deposition (PVD) and the like.

The present invention has been described in terms of some specific embodiments thereof. It will be appreciated that the embodiments shown in the drawings and described here and above are intended for illustrative purposes only, and are not by any manner or means intended to be restrictive on the invention. Embodiments of the invention, for example, are not restricted to only a single barrier interlayer present in the device, but also include in some applications the use of multiple barrier interlayers that may be applied in between different device layers at different levels. The context of the invention discussed here is merely restricted by the scope of the appended claims.

The invention claimed is:

1. Method of manufacturing a multilayer semiconductor element, said method comprising the steps of:

providing a carrier;

providing a first device layer on said carrier by solution printing of a first material solution for forming said first device layer; and providing a second device layer by solution printing of a second material solution on said first device layer, said second material solution comprising second device layer material dissolved in a solvent;

wherein said method comprises a step of providing prior to providing said second device layer a barrier interlayer for being arranged in between said first and said second device layer, said barrier interlayer comprising an interlayer material being insoluble to said solvent, wherein said interlayer material is a semiconductor material, and said barrier interlayer being arranged for enabling electric interaction between said first device layer and said second device layer.

2. Method according to claim 1, wherein said semiconductor material having a band gap larger than or equal to a band gap distance of said first or said second device layer.

3. Method according to claim 1, wherein providing of said barrier interlayer comprises a step of atomic layer deposition for forming said barrier interlayer on said first device layer.

4. Method according to claim 3, wherein said step of atomic layer deposition at least comprises a step of relatively moving said carrier and one or more precursor gas sources past one another.

5. Method according to claim 1, wherein said barrier interlayer is provided having a thickness dependent on said interlayer material, for effectively preventing said solvent to reach said first device layer, and for allowing said electric interaction between said first device layer and said second device layer.

6. Method according to claim 5, wherein said barrier interlayer is provided having said thickness within a range of at least one monolayer for a semiconductor type barrier interlayer.

7. Method according to claim 1, wherein said interlayer material comprises a semiconductor material, and wherein said semiconductor material comprises at least one of a group comprising doped or undoped oxide semiconductor materials and oxide semiconductor materials comprising substoichiometric oxide, such as doped or undoped ZnO, doped or undoped SnOx such as ITO, doped or undoped ZrOx, doped or undoped InOx, doped or undoped RuOx, doped or undoped WOx, doped or undoped EuOx, doped or undoped NiOx, doped or undoped VOx, doped or undoped PbOx, doped or undoped CeOx, doped or undoped MoOx, doped or undoped Ni2O3, or doped or undoped ZnxSnyOz, and non-oxide semiconductor materials, such as doped or undoped ZnS, and doped or undoped ZnSe, ZnTe, CdS, and CdSe, and organic semiconductor materials, such as Alx-GayIn1−x−yN or other semiconductor nitrides or sulfides.

8. Method according to claim 1, wherein said multilayer semiconductor device comprises a multilayer organic semiconductor element.

9. Method according to claim 8, wherein said multilayer organic semiconductor element is an organic light emitting diode (OLED) or an organic photo voltaic element (OPV).

* * * * *